(12) United States Patent  (10) Patent No.: US 9,049,794 B2
Morita et al.                (45) Date of Patent:     Jun. 2, 2015

(54) WIRING SUBSTRATE AND METHOD FOR MANUFACTURING THE WIRING SUBSTRATE

(75) Inventors: Yoshihiro Morita, Kawasaki (JP); Takahiro Ooi, Kawasaki (JP); Tetsuro Yamada, Kawasaki (JP); Akiko Matsui, Kawasaki (JP); Mitsuhiko Sugane, Kawasaki (JP); Takahide Mukoyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 344 days.

(21) Appl. No.: 13/075,865

(22) Filed: Mar. 30, 2011

(65) Prior Publication Data

US 2011/0308842 A1    Dec. 22, 2011

(30) Foreign Application Priority Data

Jun. 21, 2010 (JP) ................................ 2010-140951

(51) Int. Cl.
    *H05K 1/09*     (2006.01)
    *H05K 7/00*     (2006.01)
    *H05K 1/03*     (2006.01)
    (Continued)

(52) U.S. Cl.
    CPC .......... *H05K 1/0366* (2013.01); *Y10T 29/49124* (2015.01); *D03D 15/0011* (2013.01); *D03D 15/0088* (2013.01); *D10B 2401/18* (2013.01); *D10B 2505/02* (2013.01); *H05K 1/024* (2013.01); *H05K 1/0245* (2013.01); *H05K 1/0248* (2013.01); *H05K 2201/029* (2013.01); *H05K 2201/091* (2013.01); *H05K 2203/0195* (2013.01)

(58) Field of Classification Search
    CPC ...................................................... H05K 1/024
    USPC .................... 174/251, 255, 258, 262, 117 M; 361/777; 333/247
    See application file for complete search history.

(56) References Cited

U.S. PATENT DOCUMENTS 2,874,209 A * 2/1959 August .......................... 174/167
5,348,792 A * 9/1994 Hattori et al. ................. 361/748
6,447,886 B1 * 9/2002 Mohamed et al. ............ 174/255
(Continued)

FOREIGN PATENT DOCUMENTS

JP    09-076385 A     3/1997
JP    2006-100699     4/2006
(Continued)

OTHER PUBLICATIONS

Definition of "plan" from www.thefreedictioncary.com May 22, 2013.*
(Continued)

*Primary Examiner* — Chau N Nguyen
*Assistant Examiner* — Roshn Varghese
(74) *Attorney, Agent, or Firm* — Squire Patton Boggs (US) LLP

(57) ABSTRACT

A wiring substrate includes an insulation layer including a thermosetting resin and a reinforcement member having plural first fiber bundles and plural second fiber bundles woven together, the second fiber bundles being intersected with the first fiber bundles, and a pair of differential wirings arranged alongside each other on the insulation layer. The first fiber bundles and the second fiber bundles have a curved portion relative to a plan direction of the insulation layer in a region on which the pair of differential wirings is arranged.

6 Claims, 17 Drawing Sheets

(51) Int. Cl.
*D03D 15/00* (2006.01)
*H05K 1/02* (2006.01)

(56) References Cited

U.S. PATENT DOCUMENTS

| | | | |
|---|---|---|---|
| 6,727,197 B1* | 4/2004 | Wilson et al. | 174/117 F |
| 7,059,044 B2* | 6/2006 | Nishii | 29/829 |
| 2004/0181764 A1 | 9/2004 | Brist et al. | |
| 2005/0034893 A1* | 2/2005 | McCall et al. | 174/255 |
| 2006/0076683 A1 | 4/2006 | Nishida | |
| 2006/0120059 A1* | 6/2006 | Farkas et al. | 361/777 |
| 2007/0110388 A1 | 5/2007 | Alger et al. | |
| 2007/0178289 A1* | 8/2007 | Cases et al. | 174/250 |
| 2008/0176471 A1* | 7/2008 | Ogihara et al. | 442/203 |

FOREIGN PATENT DOCUMENTS

| | | |
|---|---|---|
| JP | 2009-073946 A | 4/2009 |
| WO | 2007/109483 A1 | 9/2007 |

OTHER PUBLICATIONS

Definition of "expand" from www.merriam-webster.com Nov. 17, 2014.*
Definition of "meander" from www.merriam-webster.com Nov. 17, 2014.*
European Search Report application No. 11160536.6 dated Jul. 1, 2011.
Office Action dated Jan. 7, 2014 corresponding to Japanese Patent Application No. 2010-140951 and English translation thereof.

* cited by examiner

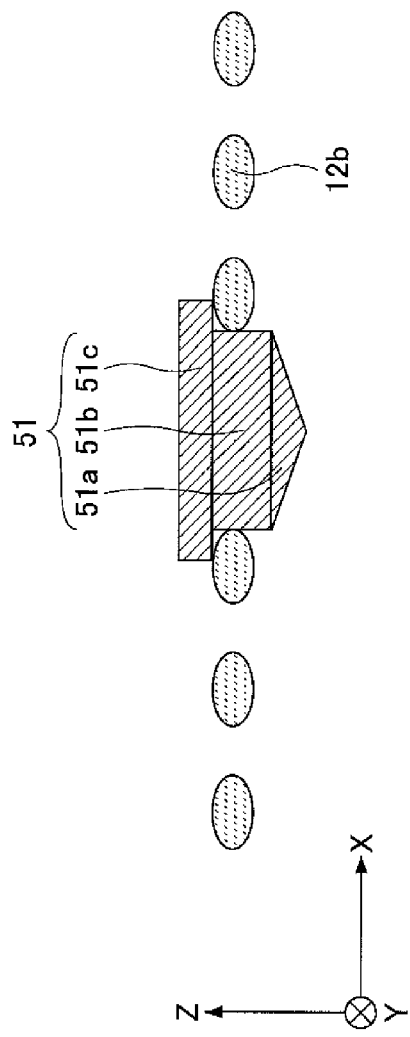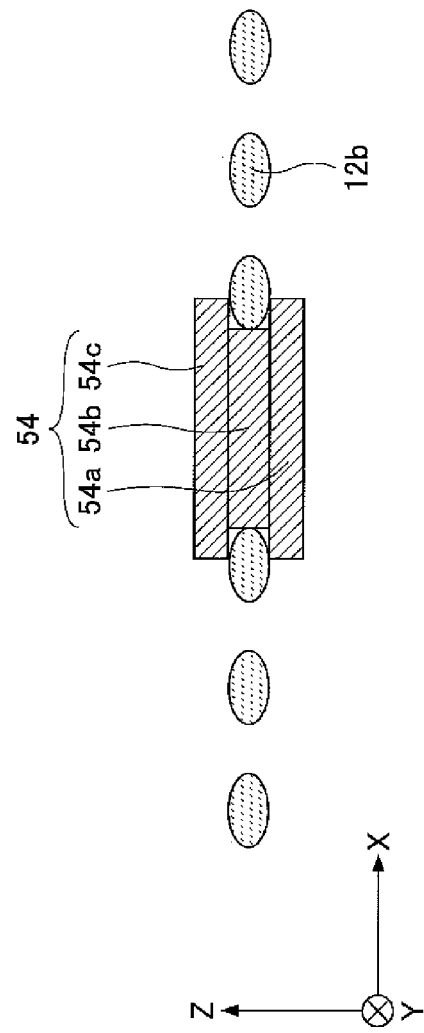

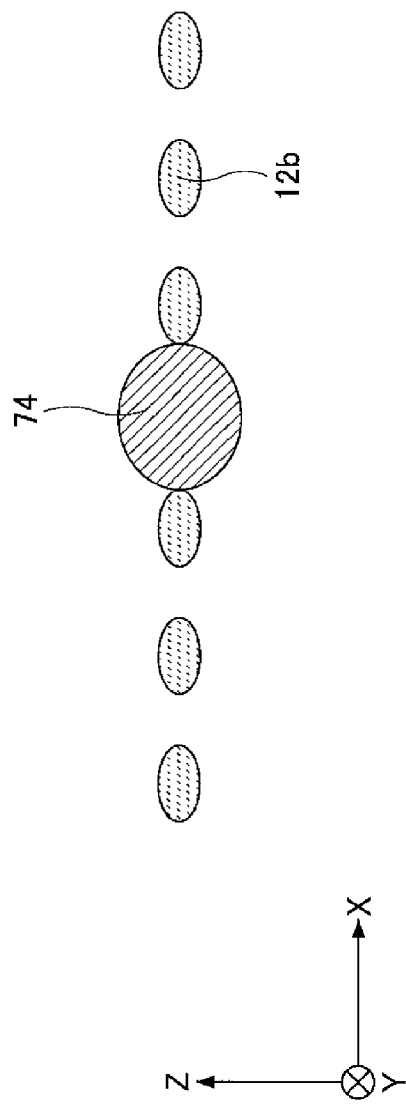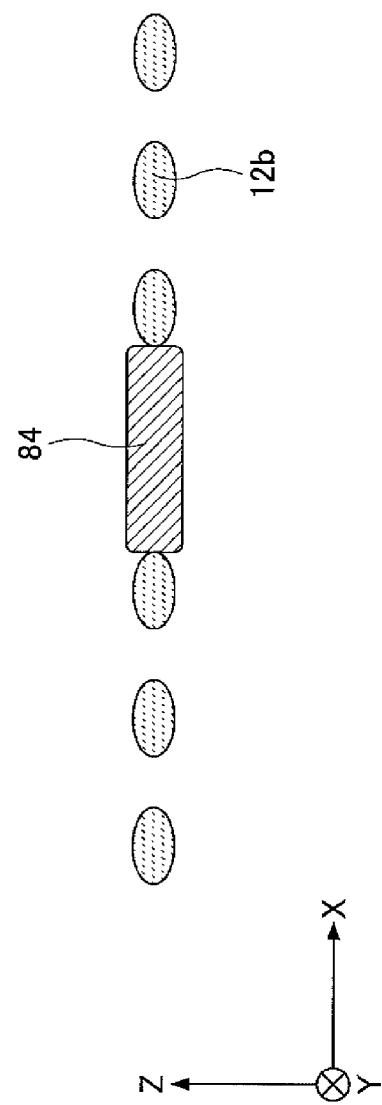

WIRING SUBSTRATE AND METHOD FOR MANUFACTURING THE WIRING SUBSTRATE

CROSS-REFERENCE TO RELATED APPLICATIONS

This application is based upon and claims the benefit of priority of the prior Japanese patent application No. 2010-140951 filed on Jun. 21, 2010, the entire contents of which are incorporated herein by reference.

FIELD

The embodiments discussed herein are related to a wiring substrate having a differential wiring formed on an insulation layer and a method for manufacturing the wiring substrate.

BACKGROUND

FIG. 1 is a plan transparent view illustrating a main part of a wiring substrate 100 of a related art example. FIG. 2 is a cross-sectional view illustrating a main part of the wiring substrate 100 of a related art example. It is to be noted that some of the components/elements illustrated in FIG. 2 are omitted in FIG. 1. The cross-sectional view of FIG. 2 is taken along line A-A of FIG. 1.

With reference to FIGS. 1 and 2, the wiring substrate 100 has a reference layer 170, an insulation layer, and wirings 150, 160 layered thereon.

The insulation layer 110 includes a glass cloth 120 and a thermosetting resin 130. The glass cloth 120 includes glass fiber bundles 120a, 120b. The glass fiber bundles 120a, 120b are impregnated in the thermosetting resin 130. The glass cloth 120 is formed by plain-weaving the glass fiber bundles 120a, 120b in a grid pattern in which the glass fiber bundles 120a are arranged in parallel with an X axis and spaced apart from each other at substantially constant intervals and the glass fiber bundles 120b are arranged in parallel with a Y axis and spaced apart from each other at substantially constant intervals. The holes (i.e. so-called basket holes) 120x created by forming the glass fiber bundles 120a, 120 are filled with the thermosetting resin 130. No glass fiber exists inside the holes 120x.

The wirings 150, 169 are selectively formed on a part(s) of a surface on one side of the insulation layer 110, and the reference layer 170 are formed substantially on the entire surface on the other side of the insulation layer 110. The wirings 150, 160 are conductors having predetermined electric signals flowing therethrough. The reference surface 170 is a conductor serving as a return circuit of the predetermined electric signals that flow through the wirings 150, 160.

The wirings 150, 160, which are arranged alongside each other, are differential wirings used for differential signaling. In general, differential signaling can achieve satisfactory high speed transmission. The wiring 150 is positioned on top of the glass fiber bundle 120b. The wiring 160 is positioned in-between adjacent glass fiber bundles 120b.

As described above, a wiring substrate of a related art example has glass fiber bundles woven as a grid pattern at a stage where the wiring substrate is a material. Because the wiring substrate of the related art example, in general, has differential wirings arranged in X and Y directions, the differential wirings are arranged in parallel or orthogonal with respect to the direction in which the glass fiber bundles are arranged. This is noticeable particularly for differential wirings used for connecting electronic components (e.g., LSI (Large Scale Integration).

Because wirings are becoming narrower compared to the pitch of glass fiber bundles, there is a case where one group of the differential wirings are arranged above the glass fiber bundles while another group of the differential wirings are arranged in-between the glass fiber bundles (i.e. above the thermosetting resin) as illustrated in FIGS. 1 and 2. Because dielectric constant of the differential wirings above the glass fiber bundles and dielectric constant of the differential wirings in-between the glass fiber bundles are different due to difference of glass fiber density (areas where glass fiber is dense and area where glass fiber is sparse), the signal transmission rate of the differential wirings above the glass fiber bundles is slower than that of the differential wirings in-between the glass fiber bundles. Therefore, in a case where one group of differential wirings is arranged above the glass fiber bundles while the other group of differential wirings is arranged in-between the glass fiber bundles (i.e. above the thermosetting resin), problems such as inconsistency of characteristic impedance and difference of transmission delay time occur.

In other words, in a case of transmitting voltage where one group of differential wirings are arranged above the glass fiber bundles while the other group of differential wirings are arranged in-between the glass fiber bundles (i.e. above the thermosetting resin), differential voltage cannot be initiated due to time lag between the differential wirings at a signal receiving side. This time lag tends to be noticeable particularly when transmission distance is long and is a problem for high speed transmission. As a countermeasure to this problem, there is, for example, a method of reducing the influence of inconsistent glass fiber density (dense/sparse areas of glass fiber) by arranging the differential wirings diagonally with respect to the glass fiber bundles arranged as a grid pattern.

However, terminals of a typical electronic component are arranged as a rectangle. Thus, it is difficult to arrange differential wirings diagonally with respect to glass fiber bundles arranged as a grid pattern. Further, although it is possible to weave glass fibers of a wiring substrate material diagonally, the glass fibers of the wiring substrate material are to be cut out diagonally in a case where the wiring substrate material is a ready-made belt-like material. This results to waste of the wiring substrate material. Further, in the case of weaving the glass fibers diagonally, there is a problem of requiring new investment in plant and machinery. In any event, substrate manufacturing conditions is to be reconsidered in a case of fabricating glass fibers diagonally with respect to the outer configuration of the substrate because factors such as shrinkage rate of resin during a substrate laminating process or a perforating process are different compared to a substrate manufacturing method of a related art example.

SUMMARY

According to an aspect of the invention, there is provided a wiring substrate including an insulation layer including a thermosetting resin and a reinforcement member having plural first fiber bundles and plural second fiber bundles woven together, the second fiber bundles being intersected with the first fiber bundles, and a pair of differential wirings arranged alongside each other on the insulation layer, wherein the first fiber bundles and the second fiber bundles have a curved portion relative to a plan direction of the insulation layer in a region on which the pair of differential wirings is arranged.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

BRIEF DESCRIPTION OF DRAWINGS

FIGS. 15A and 15B are schematic diagrams for illustrating a process of inserting a fine-size component according to an embodiment of the present invention (Part 1);

FIGS. 17A and 17B are schematic diagrams for illustrating a process of inserting a fine-size component according to an embodiment of the present invention (Part 2).

DESCRIPTION OF EMBODIMENTS

Embodiments according to the present invention are described with reference to the accompanying drawings.

With the wiring substrate and method for manufacturing the wiring substrate according to the below-described embodiments of the present invention, effects (advantages) such as easily preventing wirings from being adversely affected by inconsistent glass fiber density (sparse and dense parts of glass fiber).

First Embodiment

Configuration of Wiring Substrate According to the First Embodiment

Figure 1:
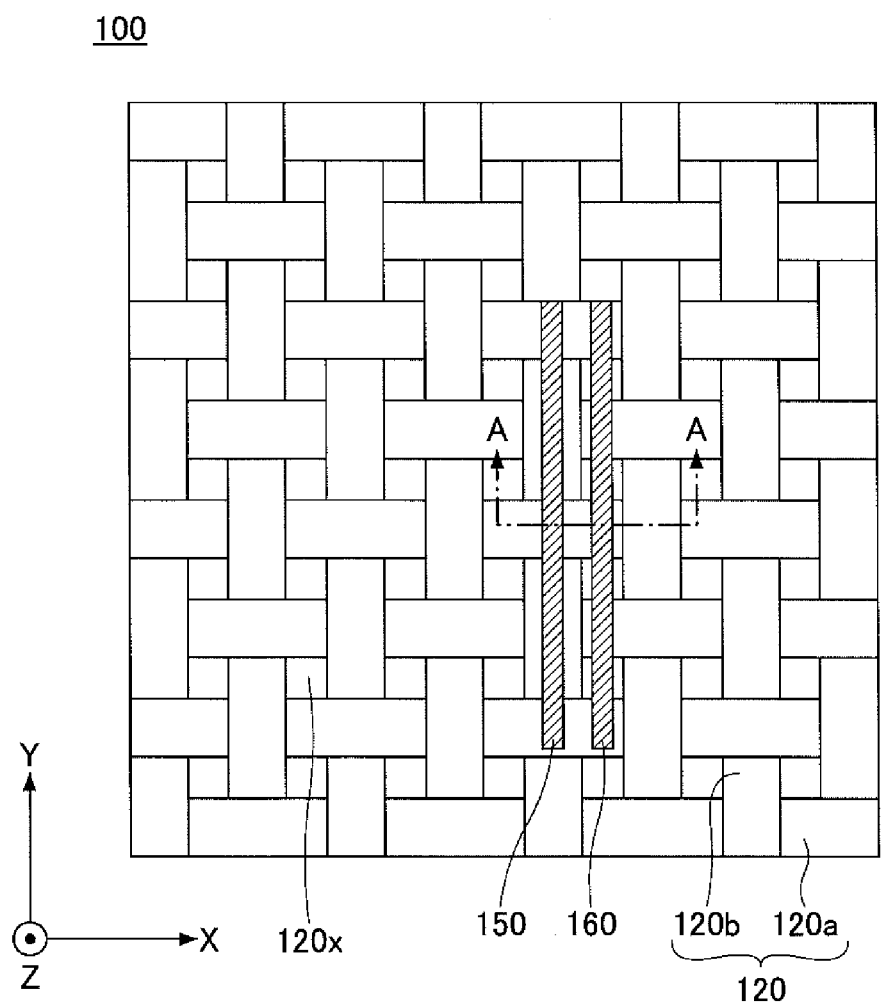
FIG. 1 is a plan transparent view illustrating a main part of a wiring substrate of a related art example.
Figure 2:
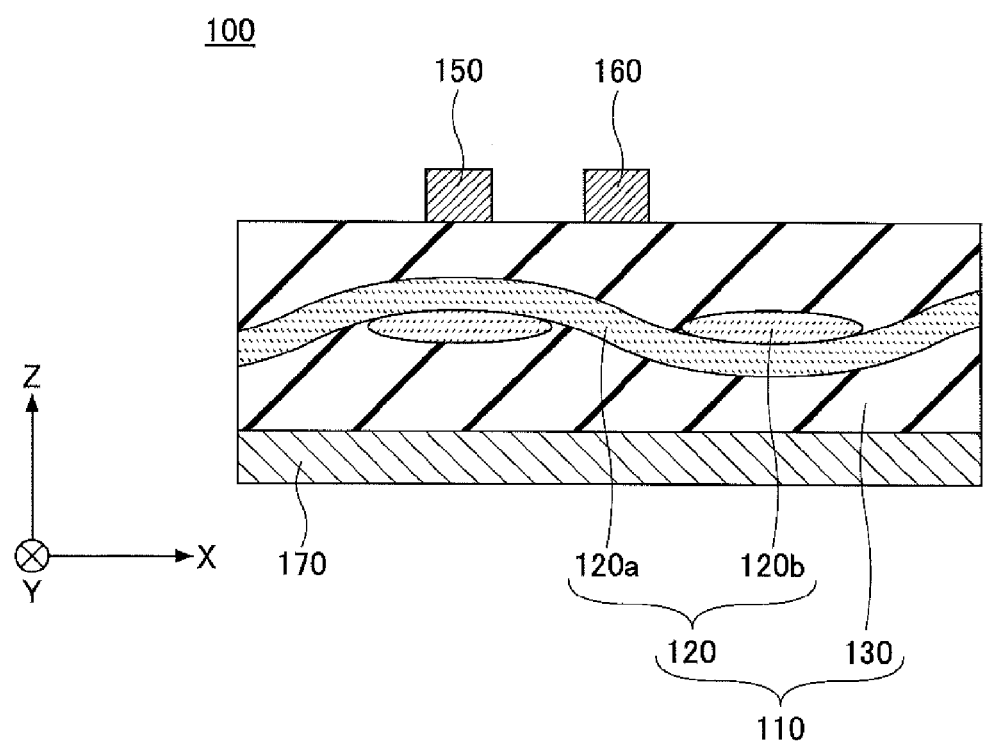
FIG. 2 is a cross-sectional view illustrating a main part of a wiring substrate of a related art example.
Figure 3:
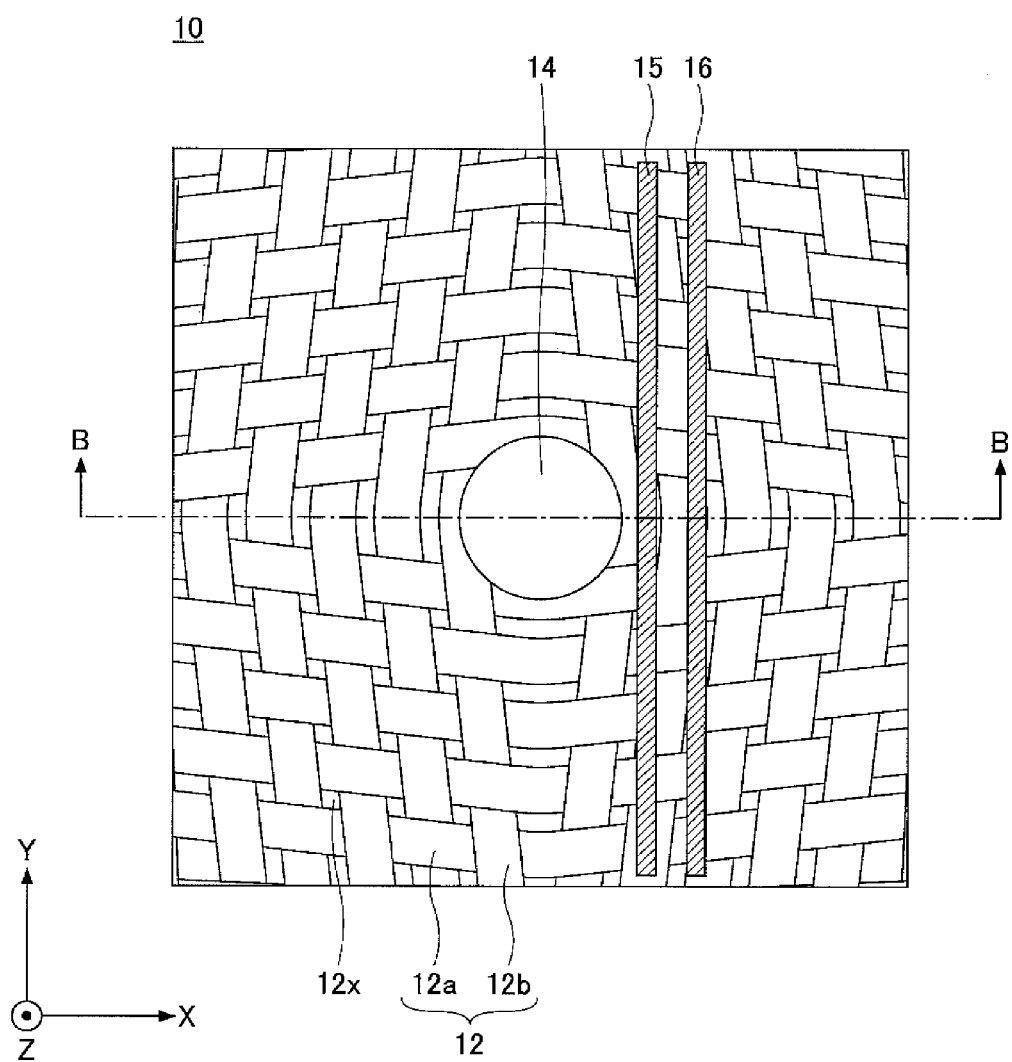
FIG. 3 is a plan transparent view illustrating a main part of a wiring substrate according to a first embodiment of the present invention.
Figure 4:
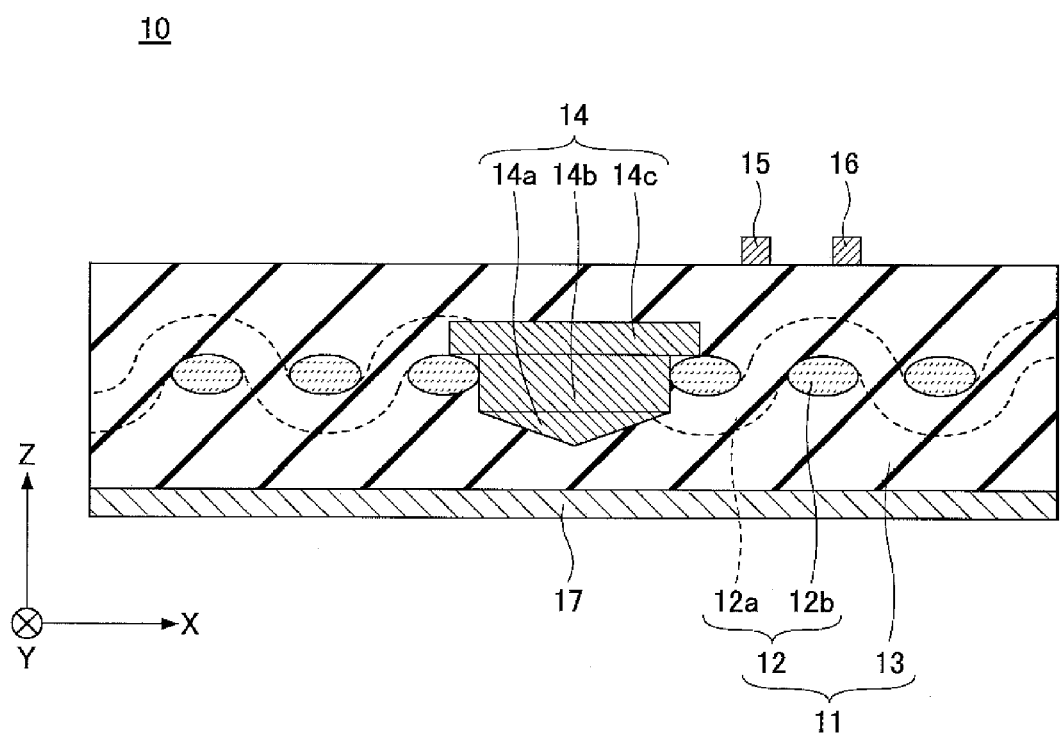
FIG. 4 is a cross-sectional view illustrating a main part of a wiring substrate according to a first embodiment of the present invention.

FIG. 3 is a plan transparent view illustrating a main part of a wiring substrate 10 according to a first embodiment of the present invention. FIG. 4 is a cross-sectional view illustrating a main part of the wiring substrate 10 according to the first embodiment of the present invention. It is to be noted that some of the components/elements illustrated in FIG. 4 are omitted in FIG. 3. The cross-sectional view of FIG. 4 is taken along line A-A of FIG. 3.

With reference to FIGS. 3 and 4, the wiring substrate 10 has a reference layer 17, an insulation layer 11, and wirings 15, 16 layered thereon. The elements (components) of the wiring substrate 10 are described in detail below.

The insulation layer 11 includes a glass cloth 12, a thermosetting resin 13, and a fine-size component 14. The glass cloth 12 includes glass fiber bundles 12a, 12b. The glass fiber bundles 12a, 12b are impregnated in the thermosetting resin 13. Each string of fiber of the glass fiber bundles 12a, 12b has a diameter of, for example, a several μm. By bundling the strings of fibers, the glass fiber bundles 12a, 12b are formed having a diameter of, for example, several hundred μm. The holes (i.e. so-called basket holes) 12x created by forming the glass fiber bundles 12a, 12b are filled with the thermosetting resin 13. No glass fiber exists inside the holes 12x. The material of the thermosetting resin 13 may be, for example, epoxy resin, polyimide resin, or polyester resin. The thermosetting resin 13 may contain a filler such as silica or alumina.

The glass cloth 12 is a reinforcement member formed by weaving (e.g., plain weaving) the glass fiber bundles 12a, 12b in a grid pattern in which the glass fiber bundles 12a are arranged in parallel with an X axis and spaced apart from each other at substantially constant intervals and the glass fiber bundles 12b are arranged in parallel with a Y axis and spaced apart from each other at substantially constant intervals. Fine-size components 14 are inserted in some of the holes 12x formed by the adjacently arranged glass fiber bundles 12a and glass fiber bundles 12b.

Thereby, the grid pattern of the glass cloth 12 is bent (deformed) at predetermined regions surrounding the parts where the fine-size components 14 are inserted (hereinafter also simply referred to as "predetermined insertion regions"). Thus, the glass fiber bundles 12a are no longer parallel to the X axis but have a curved portion relative to a plan direction (direction parallel to the X-Y plane) of the insulation layer 11. In other words, at the predetermined regions surrounding the parts where the fine-size components 14 are inserted, the intervals of the glass fiber bundles 12a (intervals in the Y direction) adjacent to the fine-size components 14 are inconsistent. That is, a pitch between adjacent glass fiber bundles 12a is varied with location in the predetermined regions surrounding the parts where the fine-size components 14 are inserted (i.e. regions on which the wirings 15, 16 are arranged). For example, the glass fiber bundles 12a have a curved portion formed in a manner that the intervals become widest near the fine-size components 14 and become narrower the farther from the fine-size components 14 in the X direction.

Likewise, because the grid pattern of the glass cloth 12 is bent at predetermined regions surrounding the parts where the fine-size components 14 are inserted, the glass fiber bundles 12b are no longer parallel to the Y axis but have a curved portion relative to a plan direction of the insulation layer 11. In other words, at the predetermined regions surrounding the parts where the fine-size components 14 are inserted, the intervals of the glass fiber bundles 12b (intervals in the X direction) adjacent to the fine-size components 14 are inconsistent. That is, a pitch between adjacent glass fiber bundles 12b is varied with location in the predetermined regions surrounding the parts where the fine-size components 14 are inserted (i.e. regions on which the wirings 15, 16 are arranged). For example, the glass fiber bundles 12b have a curved portion formed in a manner that the intervals become widest near the fine-size components 14 and become narrower the farther from the fine-size components 14 in the Y direction.

The diameter of the fine-size component 14 is set to be greater than the intervals between adjacently arranged glass fiber bundles 12a prior to inserting the fine-size components 14 and the intervals between adjacently arranged glass fiber bundles 12b prior to inserting the fine-size components 14. That is, the holes 12x, which are surrounded by the glass fiber bundles 12a, 12b, are formed having different dimension therebetween in the region on which the wirings 15, 16 are arranged. Accordingly, among the holes 12x, the holes 12x into which the fine-size components 14 are expanded in the plan direction. Thereby, the glass fiber bundles 12a, 12b are bent and form a curved shape. Further, the intervals between adjacently arranged glass fiber bundles 12a and the intervals between adjacently arranged glass fiber bundles 12b become wider compared to the state before the fine-size components 14 are inserted. In a case where the width of the intervals between adjacently arranged glass fiber bundles 12a prior to inserting the fine-size components 14 is different from the width of the intervals between adjacently arranged glass fiber bundles 12b prior to inserting the fine-size components 14, the diameter of the fine-size component 14 may be increased so that the diameter of the fine-size component 14 is greater than the intervals of the glass fiber bundles 12a or the intervals of the glass fiber bundles 12b having greater width.

For example, the intervals between adjacently arranged glass fiber bundles 12a prior to inserting the fine-size components 14 and the intervals between adjacently arranged glass fiber bundles 12b prior to inserting the fine-size components 14 may range from approximately 100 μm to 500 μm.

A bundle of plural fiber strings of carbon fiber, polyester fiber, tetron fiber, nylon fiber, or aramid fiber may be used as alternatives of the glass fiber bundles 12a, 12b formed by bundling together plural fiber strings of glass fiber. Further, the method of weaving the glass fiber bundles 12a, 12b (or the other alternatives of the glass fiber bundles 12a, 12b) is not limited to plain-weaving. For example, satin weaving or twill weaving may be used as the method of weaving the glass fiber bundles 12a, 12b or the other alternatives of the glass fiber bundles 12a, 12b.

The fine-size component 14 may have any shape as long as the intervals between the adjacently arranged glass fiber bundles 12a, 12b can be widened by inserting the fine-size component 14. In the example illustrated in FIGS. 3 and 4, the fine-size component 14 includes an introduction part 14a having a triangular pyramid-shape, an interval maintaining part 14b having a circular cylinder shape, and a stopper part 14c having circle planar shape with a diameter greater than that of the interval maintaining part 14b. In an alternative example, the fine-size component 14 may be formed without the introduction part 14a and the stopper part 14c and formed including only the interval maintaining part 14b. The diameter of the interval maintaining part 14b of the fine-size component 14 may range, for example, from approximately 200 μm to 1000 μm. The thickness of the interval maintaining part 14b of the fine-size component 14 may range, for example, from approximately 20 μm to 200 μm. The material of the fine-size component 14 may be, for example, glass, resin, or metal.

The wirings 15, 16 are a pair of differential wirings used for differential signaling. The wirings 15, 16 are selectively formed on a part of a surface of one side of the insulation layer 11 and arranged alongside each other. The reference layer 17 is formed substantially on the entire surface of the other side of the insulation layer 11. The wirings 15, 15 are conductors allowing predetermined electric signals to flow therethrough. The reference layer 17 is a conductor serving as a return circuit of the predetermined electric signals that flow through the wirings 15, 16. Differential signaling is a method of transmitting signals by using POS signals and NEG signals (inverted POS signals). Differential signaling is used particularly for high speed transmission. For example, POS signals are transmitted through the wirings 15 and NEG signals are transmitted through the wirings 16 arranged alongside the wirings 15. The wirings 15 and 16 can achieve satisfactory high speed transmission as long as there is no inconsistent characteristic impedance or fluctuation of transmission speed.

The width of the wirings 15, 16 may range, for example, from 100 μm to 200 μm. The pitch of the wirings 15, 16 may range, for example, from 250 μm to 400 μm. It is to be noted that the wirings 15, 16 are arranged parallel to the X axis or the Y axis. Alternatively, the wirings 15, 16 may include a portion arranged parallel to the X axis and a portion arranged parallel to the Y axis. It is preferable for the distance between the wirings 15 and the wirings 16 of the fine-size component 14 to be 0.2 mm or more. This is preferable, particularly, in a case where the fine-size component 14 is formed of metal because aging of the metal may cause the wirings 15, 16 to short-circuit. The material of the wirings 15, 16 and the reference layer 17 is not limited in particular as long as the material is a conductor. However, the wirings 15, 16, and the reference layer 17 may be formed of, for example, copper (Cu), aluminum (Al), gold (Au), or silver (Ag).

In the predetermined regions surrounding the parts where the fine-size components 14 are inserted, the glass fiber bundles 12a are curved along the X direction and are not parallel to the X direction. Further, in the predetermined regions surrounding the parts where the fine-size components 14 are inserted, the glass fiber bundles 12b are curved along the Y direction and are not parallel to the X direction. On the other hand, the wirings 15, 16 are arranged parallel to the X axis or the Y axis. That is, by arranging the wirings 15, 16 at the predetermined regions surrounding the parts where the fine-size components 14 are inserted, the wirings 15, 16 are positioned above the glass fiber bundles 12a, 12b arranged diagonally relative to the X axis or the Y axis.

Accordingly, portions of the wirings 15, 16 positioned above the glass fiber bundles 12a, 12b and portions of the wirings 15, 16 positioned in-between the glass fiber bundles 12a and the glass fiber bundles 12b (i.e. positioned above the thermosetting resin) can be evenly arranged on the wiring substrate 10. As a result, compared to the wiring substrate of the related art example, the wiring substrate 10 can reduce adverse effects due inconsistent glass fiber density (sparse and dense parts of glass fiber). Further, the wiring substrate 10 can reduce inconsistent characteristic impedance or difference of transmission delay time. Thus, the wiring substrate 10 can achieve high speed transmission.

According to the above-described related art example, there is a method of arranging wirings diagonally relative to the X axis or the Y axis on a glass cloth having glass fiber bundles arranged parallel to the X axis or the Y axis. Unlike the method of the relative art example, the above-described embodiment of the present invention wirings can position wirings diagonally relative to the X axis or the Y axis by arranging the wirings on a wiring substrate having curved glass fiber bundles. Thus, wirings can be positioned diagonally with respect to glass fiber bundles more easily compared to the method of the related art example.

Figure 5:
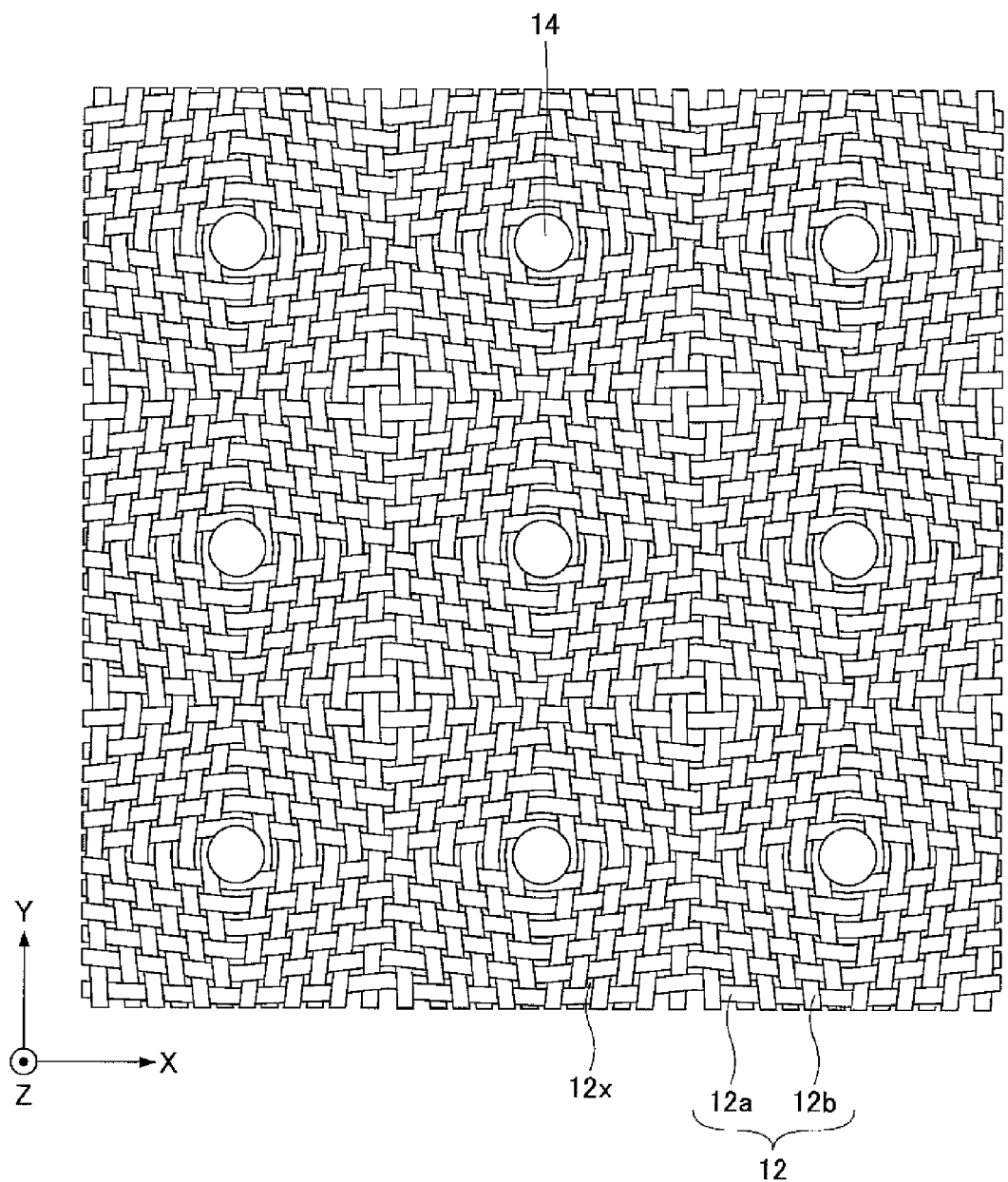
FIG. 5 is a schematic diagram illustrating plural fine-size components inserted to a glass cloth in a linear manner according to an embodiment of the present invention.

Although FIGS. 3 and 4 illustrate the fine-size component 14 inserted to one of the holes 12x of the glass cloth 12, it is preferable to insert plural fine-size components 14 to the holes 12x because the glass fiber bundles 12a, 12b are to be formed curving on a wide area of the wiring substrate 10 so that the wirings 15, 16 are positioned diagonally relative to the X axis or the Y axis. A single fine-size component 14 may be inserted to a hole having a diameter ranging from, for example, approximately 2 mm to 10 mm. FIG. 5 is a schematic diagram illustrating plural fine-size components 14 inserted to the glass cloth 12 in a linear manner. As illustrated in FIG. 5, by inserting the fine-size component 14 to the hole 12x of the glass cloth 12 having a diameter ranging from, for example, approximately 2 mm to 10 mm, the glass fiber bundles 12a, 12b can periodically curve throughout the wiring substrate 10 in a plan direction so that the wirings 15, 16 can be positioned diagonally relative to the X axis or the Y axis.

It is to be noted that, although FIG. 5 illustrate plural fine-size components 14 inserted to the holes 12x of the glass cloth 12 in a linear manner (grid pattern), the plural fine-size components 14 may be inserted to the holes 12x of the glass cloth 12 in a staggered manner (zigzag).

(Method for Manufacturing Wiring Substrate According to the First Embodiment)

Figure 7:
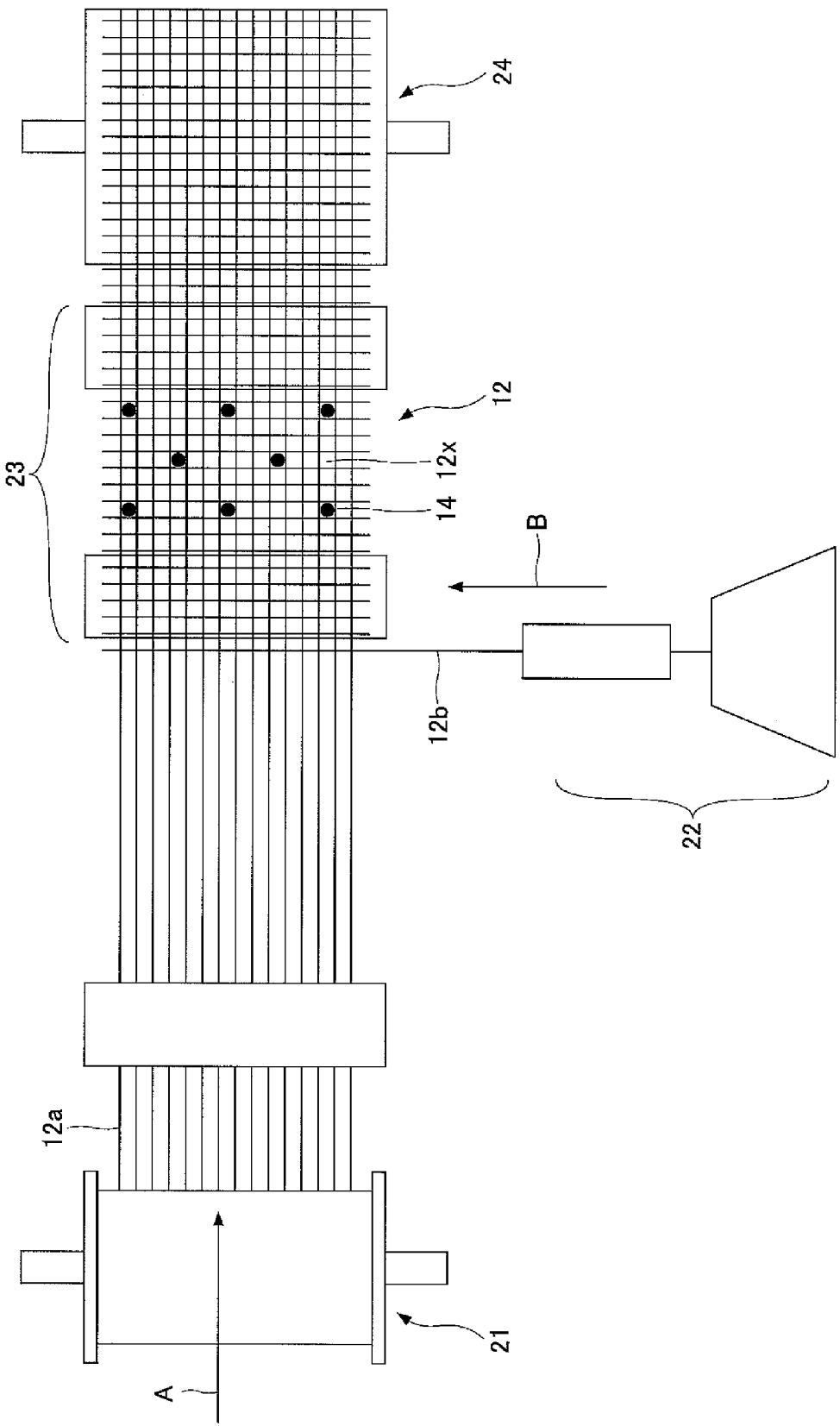
FIG. 7 is a schematic diagram illustrating processes for manufacturing a glass cloth according to an embodiment of the present invention.

Next, a method for manufacturing a wiring substrate according to the first embodiment of the present invention is described. FIG. 7 is a schematic diagram illustrating processes 21-24 for manufacturing a glass cloth 12 according to an embodiment of the present invention. With reference to FIG. 7, in a first process 21 for manufacturing the glass cloth 12, the glass fiber bundles 12 are supplied in the arrow direction A. Then, in a second process 22 for manufacturing the glass cloth 12, the glass fiber bundles 12b are supplied in the arrow direction B.

Then, in a third process (weaving process) 23 for manufacturing the glass cloth 12, the glass fiber bundles 12a supplied in the first process and the glass fiber bundles 12b supplied in the second process are woven (e.g., plain-woven). The glass fiber bundles 12a and the glass fiber bundles 12b may be woven, for example, in a manner intersecting with each other. Thereby, the glass cloth 12 can be fabricated. In the third process, the fine-size components 14 are inserted to predetermined holes 12x of the glass cloth 12. The fine-size components 14 are inserted to the corresponding holes 12x having a diameter ranging from, for example, approximately 2 mm to 10 mm.

Accordingly, the holes 12x to which the fine-size components 14 are enlarged in the plan direction compared to other holes 12x. Thereby, the grid pattern of the glass cloth 12 deforms. As a result, the glass fiber bundles 12a, 12b have curved portions relative to the plan direction. In other words, in the predetermined regions surrounding the parts where the fine-size components 14 are inserted, the intervals (Y-direction intervals) of the glass fiber bundles 12a adjacent to the fine-size components 14 are not constant. That is, the intervals of the glass fiber bundles 12a become widest the closer towards the fine-size components 14 and become narrower the farther away from the fine-size components 14 in the X-direction. Thereby, the glass fiber bundles 12a are curved along the X-direction. Further, in the predetermined regions surrounding the parts where the fine-size components 14 are inserted, the intervals (X-direction intervals) of the glass fiber bundles 12b adjacent to the fine-size components 14 are not constant. That is, the intervals of the glass fiber bundles 12b become widest the closer towards the fine-size components 14 and become narrower the farther away from the fine-size components 14 in the Y-direction. Thereby, the glass fiber bundles 12b are curved along the Y-direction.

The holes 12x to which the fine-size components 14 are inserted may be widened with, for example, a needle-like pointed projecting part before the fine-size components 14 are inserted. Then, in a fourth process (roll-up process) 24, the glass cloth 12 inserted with the fine-size components 14 is rolled up.

Figure 8:
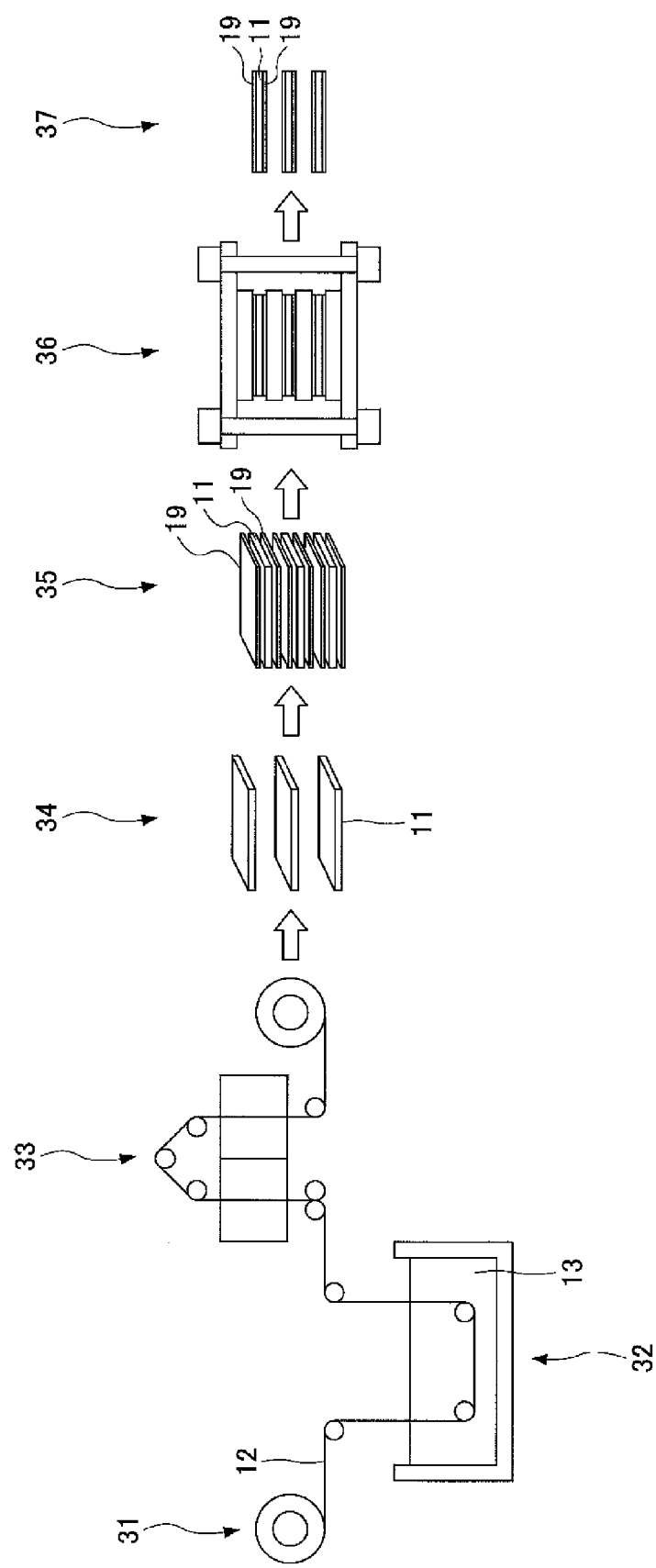
FIG. 8 is a schematic diagram illustrating processes for manufacturing a wiring substrate according to an embodiment of the present invention.

FIG. 8 is a schematic diagram illustrating processes 31-37 for manufacturing a wiring substrate 10 according to an embodiment of the present invention. The glass cloth 12 fabricated by the processes illustrated in FIG. 7 is used in wiring substrate manufacturing method illustrated in FIG. 8. With reference to FIG. 8, in a first process (glass cloth supplying process) 31, the glass cloth 12 inserted with the fine-size components 14 is supplied. Then, in a second process (resin impregnation process) 32, the glass cloth inserted with the fine-size components 14 is impregnated in the thermosetting resin 13 (e.g., epoxy resin).

Then, in a third process (drying process) 33, the thermosetting resin 13 is dried. In the drying process, the insulation stage 13 is in a B-stage state (partially cured state). Then, in a fourth process (cutting process) 34, the glass cloth 12 impregnated in the thermosetting resin 12 is cut into plural insulation layers 11. Then, in a fourth process (copper foil adhering process) 35, a copper foil 19 is adhered to both surfaces of each insulation layer 11. It is to be noted that, lastly, one of the copper foils 19 become the wirings 15, 16, and the other one of the copper foils 19 may be the reference layer 17.

Then, in a fifth process (pressing process) 36, the plural insulation layers 11 having the copper foils 19 adhered thereto are subject to a press molding process and a curing process. Thereby, the thermosetting resin 13 is fully cured. Then, in a sixth process (separating process) 37, the press-molded plural insulation layers 11 are separated. Thereby, plural insulation layers 11 having copper foils 19 formed on both surfaces can be obtained. After the separating process 37, the wirings 15, 16 are formed by performing a known method (e.g., etching) on one of the surfaces of the insulation layer 11. Thereby, the wiring substrate 10 illustrated in FIGS. 3 and 4 can be obtained. It is to be noted that, in a case where the fine-size components 14 are formed of metal, it is preferable to etch a portion of the copper foil 19 on both surfaces of the insulation layer 11, so that no copper foil 19 exists in the area surrounding the fine-size components 14. Thereby, short-circuiting between the fine-size components 14 and the copper foil 19 can be prevented.

Further, the wiring substrate 10 may be formed having a multilayer structure by alternately forming an insulation layer (s) and a wiring layer(s) on top of the insulation layer 11 on which the wirings 15, 16 are formed. In the case of forming the multilayer structure, the insulation layer to be formed on top of the insulation layer 11 is preferred to be configured in the same manner as the insulation layer 11 (i.e. configuration having glass fiber bundles of the glass cloth positioned diagonally relative to the X axis or the Y axis). This is for preventing inconsistent characteristic impedance of differential wiring, reducing difference of transmission delay time, and achieving high speed transmission.

Figure 9:
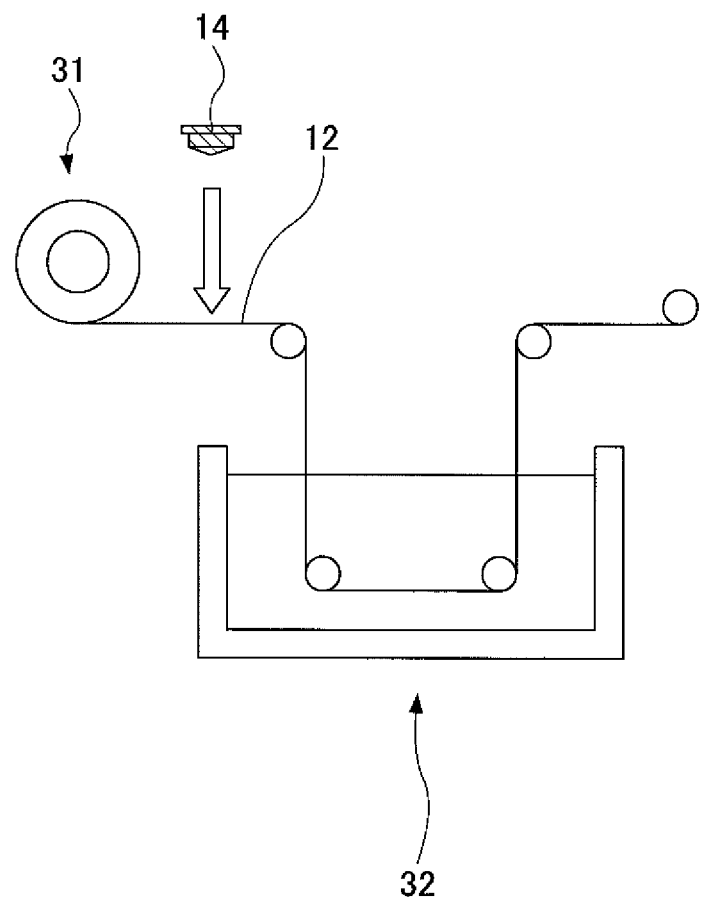
FIG. 9 is a schematic diagram for illustrating a process of inserting a fine-size component according to an embodiment of the present invention (Part 1)
Figure 10:
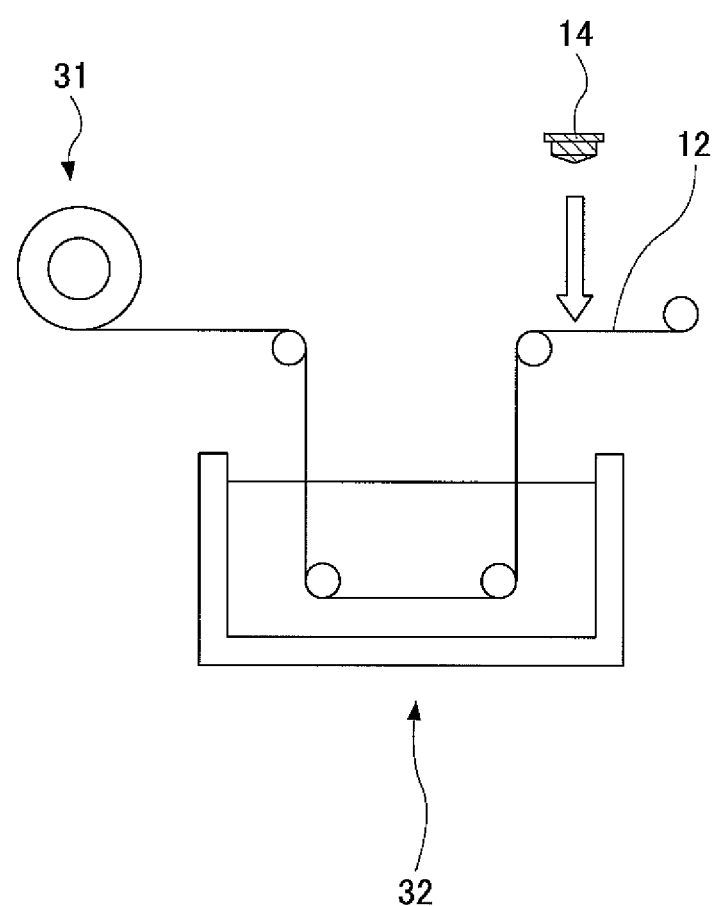
FIG. 10 is a schematic diagram for illustrating a process of inserting a fine-size component according to an embodiment of the present invention (Part 2)

Instead of inserting the fine-size components 14 to corresponding holes 12x of the glass cloth 12 in the weaving process 23 of FIG. 7, the fine-size components 14 may be inserted before the resin impregnation process (see FIG. 9) or after the resin impregnation process (see FIG. 10).

With the configuration of the wiring substrate and the method for manufacturing the wiring substrate according to the above-described first embodiment of the present invention, glass cloth can be bent (deformed) at regions surrounding the parts where fine-size components are inserted. Thereby, glass fiber bundles forming the glass cloth can be positioned diagonally relative to the X axis or the Y axis. By arranging differential wirings parallel to the X axis or the Y axis on the glass cloth including the diagonally positioned glass fiber bundles, portions of the differential wirings positioned above the glass fiber bundles and portions of the differential wirings positioned in-between the glass fiber bundles (i.e. positioned above the thermosetting resin) can be evenly arranged on the wiring substrate. As a result, compared to a wiring substrate of a related art example, the wiring substrate according to the first embodiment of the present invention can reduce adverse effects due inconsistent glass fiber density (sparse and dense parts of glass fiber). Further, the wiring substrate according to the first embodiment of the present invention can reduce inconsistent characteristic impedance or difference of transmission delay time. Thus, the wiring substrate according to the first embodiment of the present invention can achieve high speed transmission.

With the above-described first embodiment of the present invention, there is no need to arrange wirings diagonally with respect to glass fiber bundles woven in a grid pattern. Therefore, the wirings can be easily fabricated. Unlike a method of forming glass fiber bundles of a wiring substrate material diagonally according to a related art example, the first embodiment of the present invention does not need to diagonally cut out the glass fiber bundles from a ready-made belt-like material. Thus, wasting of material can be prevented. Because the shrinkage of resin in a substrate laminating process or a perforating process is substantially the same as the related art example, there is no need to reconsider the conditions for manufacturing the wiring substrate. That is, adverse effects due inconsistent glass fiber density (sparse and dense parts of glass fiber) can be easily reduced by the wiring substrate and the method for manufacturing the wiring substrate according to the above-described first embodiment of the present invention.

First Modified Example of First Embodiment

In the first modified example of the first embodiment, a wiring substrate 40 is formed having the fine-size component 14 removed after the glass fiber bundles 12a, 12b are diagonally positioned relative to the X axis or the Y axis by the fine-size component 14 being inserted into the glass cloth 12.

Figure 11:
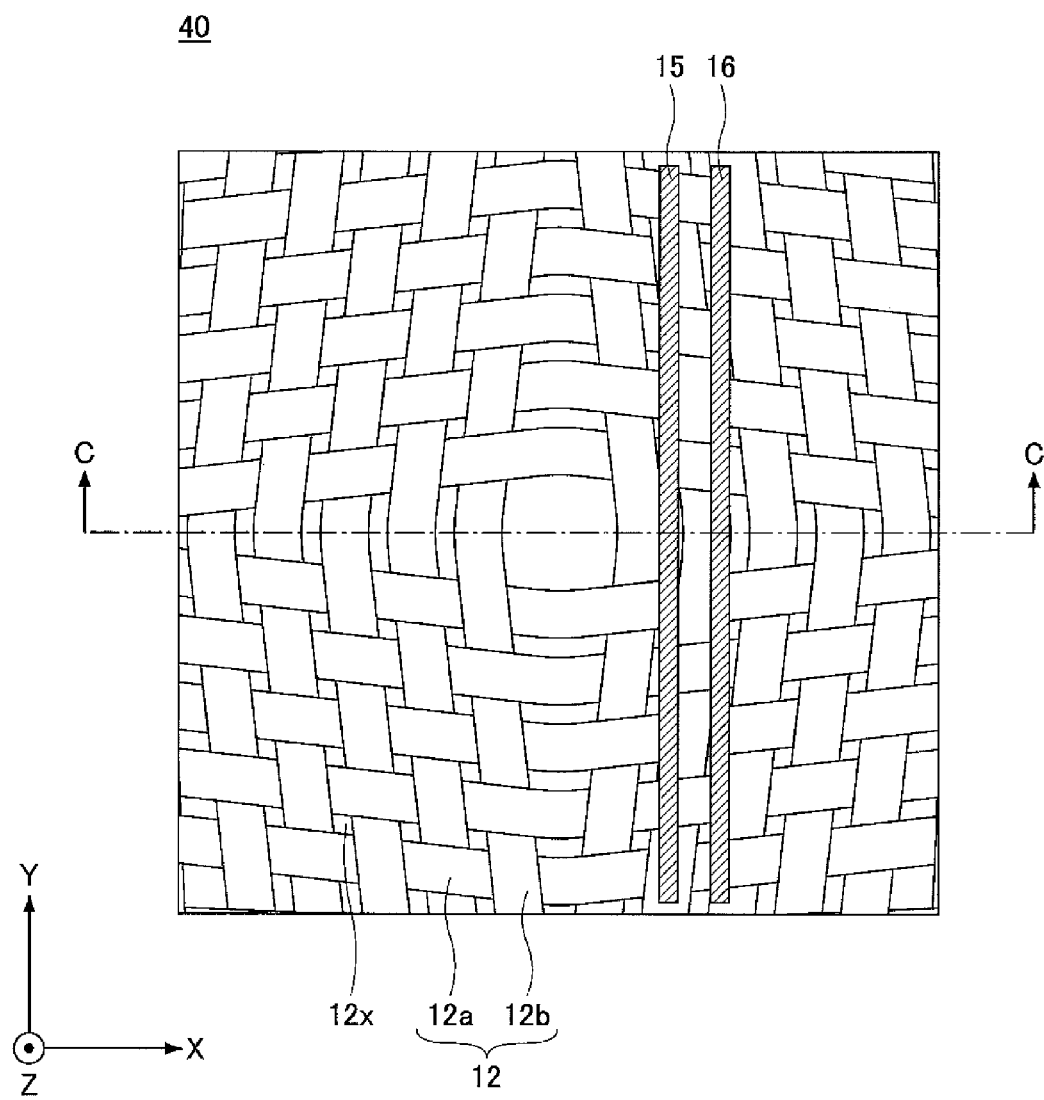
FIG. 11 is a plan transparent view illustrating a main part of a wiring substrate according to a first modified example of the first embodiment.
Figure 12:
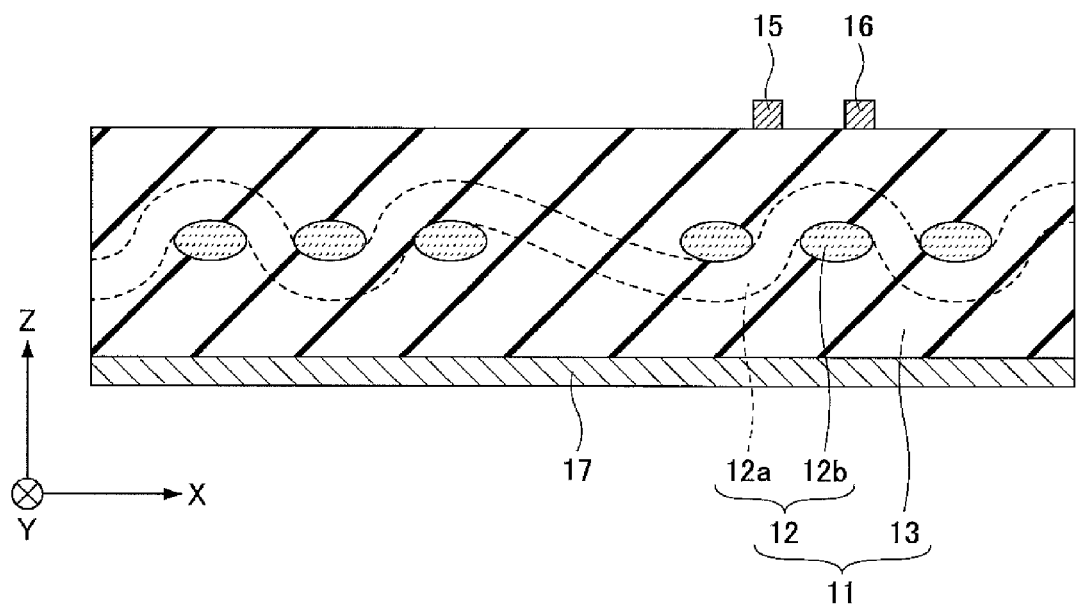
FIG. 12 is a cross-sectional view illustrating a main part of the wiring substrate of a first modified example of the first embodiment.

FIG. 11 is a plan transparent view illustrating a main part of a wiring substrate 40 according to the first modified example of the first embodiment. FIG. 12 is a cross-sectional view illustrating a main part of the wiring substrate 40 of the first modified example of the first embodiment. It is to be noted that some of the components/elements illustrated in FIG. 12 are omitted in FIG. 11. The cross-sectional view of FIG. 12 is taken along line C-C of FIG. 11. With reference to FIGS. 11 and 12, the wiring substrate 40 is different from the wiring substrate 10 in that the wiring substrate 40 includes no fine-size components 14. In the wiring substrate 40, like components are denoted with like reference numerals and are not described in further detail.

Figure 13:
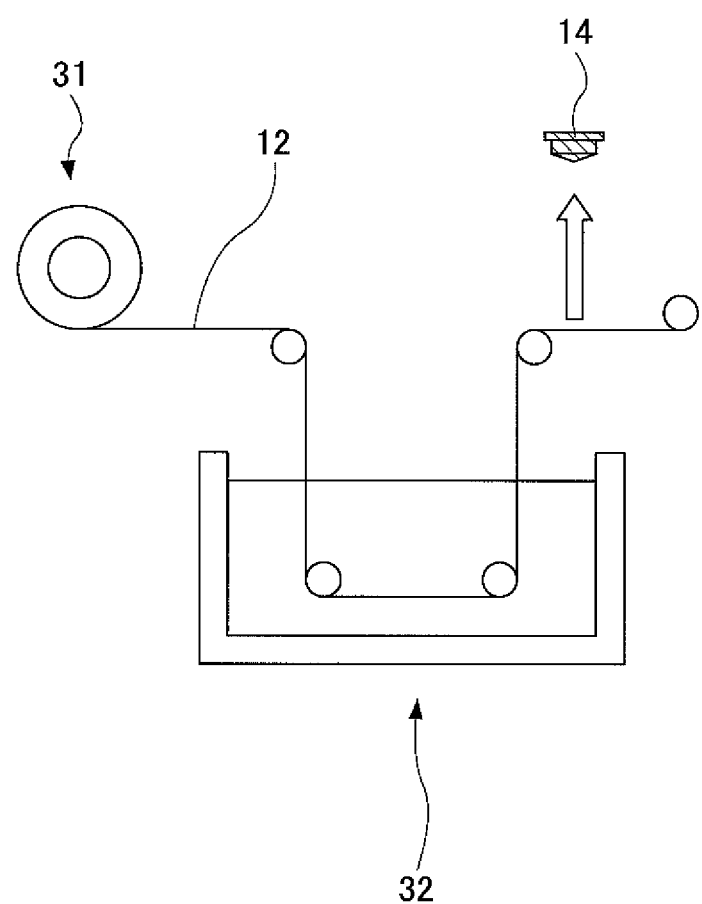
FIG. 13 is a schematic diagram for illustrating a process of removing a fine-size component according to an embodiment of the present invention.

The wiring substrate 40 is configured having the fine-size component 14 removed after the glass fiber bundles 12a, 12b are diagonally positioned relative to the X axis or the Y axis owing to the bending at predetermined insertion regions of the glass cloth 12 caused by inserting the fine-size component 14 into the glass cloth 12. The fine-size component 14 is inserted before the weaving process 23 (see FIG. 7) or the resin impregnation process 32 (see FIG. 9) and removed after the resin impregnation process (see FIG. 13). Because the thermosetting resin 13 is in a B-stage state (partially cured state), the glass cloth 12 remains bent and does not return to its initial shape even after the fine-size component 14 is removed. Then, because the thermosetting resin 13 is fully cured in the pressing process 36, the glass fiber bundles 12a, 12b are maintained in a position diagonal relative to the X axis or the Y axis.

Figure 6:
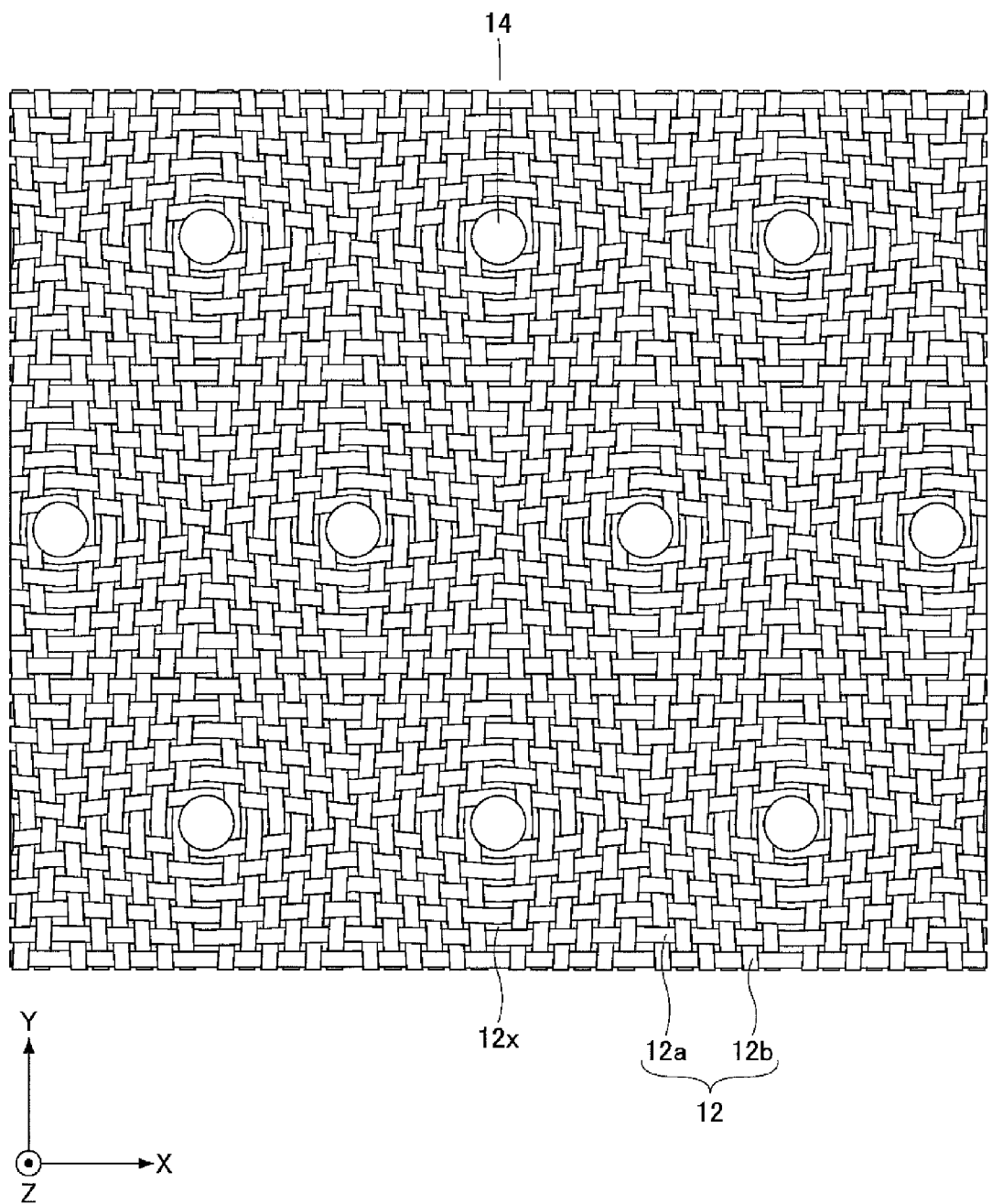
FIG. 6 is a schematic diagram illustrating plural fine-size components inserted to a glass cloth in a staggered manner according to an embodiment of the present invention.

In an alternative example, plural fine-size components 14 may be inserted to the glass cloth 12 to cause the glass cloth 12 to bend and position the glass fiber bundles 12a, 12b to diagonal relative to the X axis or the Y axis as illustrated in FIG. 5 or FIG. 6. Then, after the insertion of the plural fine-size components 14, the plural fine-size components 14 may be removed from the glass cloth 12.

As described above, the first modified example of the first embodiment can attain the same advantages (effects) as those of the first embodiment because the glass fiber bundles 12a, 12b maintain a diagonal position relative to the X axis or the Y axis even after the fine-size component 14 is removed after inserting the fine-size component and causing the predetermined insertion region of the glass cloth 12 to bend.

Second Modified Example of First Embodiment

Figure 14:
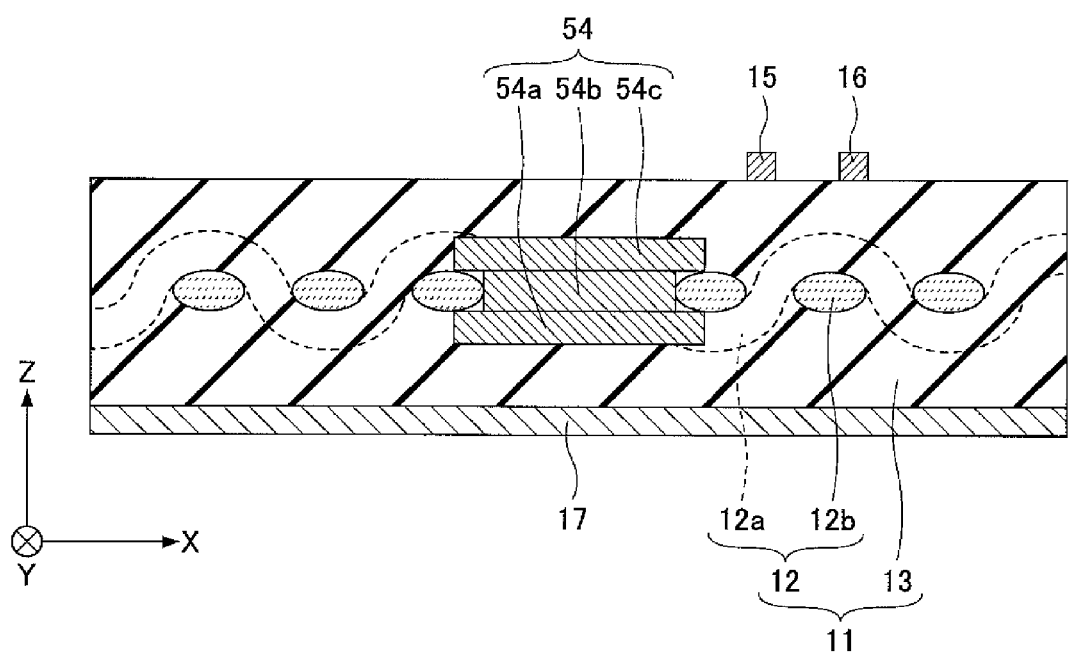
FIG. 14 is a cross-sectional view illustrating a main part of a wiring substrate of a second modified example of the first embodiment.

In the second modified example of the first embodiment, a fine-size component 54 is formed having a shape different from the fine-size component 14 of the first embodiment. FIG. 14 is a cross-sectional view illustrating a main part of a wiring substrate 50 of the second modified example of the first embodiment. With reference to FIG. 14, the wiring substrate 50 is different from the wiring substrate 10 in that the fine-size component 14 is replaced with the fine-size component 54. In the wiring substrate 50, like components are denoted with like reference numerals of the wiring substrate 10 and are not described in further detail.

As illustrated in FIG. 14, the fine-size component 54 having the shape illustrated in FIG. 14 may be used instead of the fine-size component 14. The fine-size component 54 has a shape in which a circular cylindrical shaped interval maintaining part 54b is interposed between a circular disk shaped stopper part 54a and a circular disk shaped stopper part 54b by providing the stopper part 54a beneath the interval maintaining part 54b and providing the stopper part 54c on top of the interval maintaining part 54b. Each of the stopper parts 54a, 54c has a diameter larger than the diameter of the interval maintaining part 54b. The fine-size component 54 may be inserted or pressed into the hole 12x of the glass cloth 12 before the weaving process 23 (see FIG. 7), before the resin impregnation process 32 (see FIG. 9) or after the resin impregnation process 32 (see FIG. 10).

Further, as illustrated in FIG. 15A, a fine-size component 51, which includes an introduction part 51a having a triangular pyramid-shape, an interval maintaining part 51b having a circular cylinder shape, and a stopper part 51cc having circle planar shape with a diameter greater than that of the interval maintaining part 51*b*, may be inserted to the hole 12*x* of the glass cloth 12. After inserting the fine-size component 51, the shape of the fine-size component 51 may be deformed into the shape of the fine-size component 54 by applying pressure to the top and bottom of the fine-size component 51 as illustrated in FIG. 15B.

Even in a case where the fine-size component 54 is used instead of the fine-size component 14, the second modified example of the first embodiment can attain the same advantages (effects) as those of the first embodiment.

Third Modified Example of First Embodiment

Figure 16:
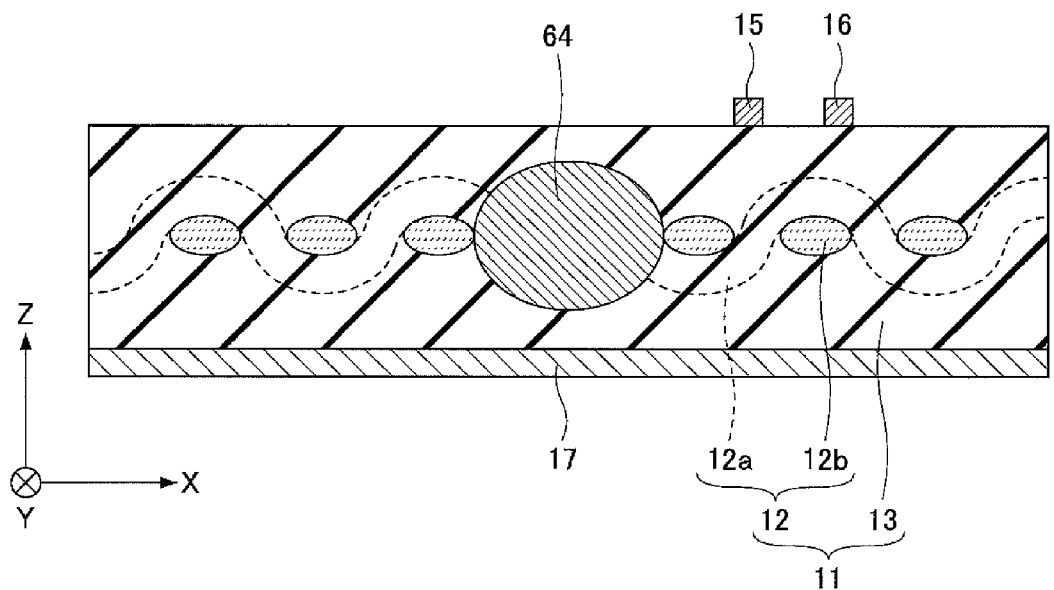
FIG. 16 is a cross-sectional view illustrating a main part of a wiring substrate of a third modified example of the first embodiment.

In the third modified example of the first embodiment, a fine-size component 64 is formed having yet another shape different from the fine-size component 14 of the first embodiment. FIG. 16 is a cross-sectional view illustrating a main part of a wiring substrate 60 of the third modified example of the first embodiment. With reference to FIG. 16, the wiring substrate 60 is different from the wiring substrate 10 in that the fine-size component 14 is replaced with the fine-size component 64. In the wiring substrate 60, like components are denoted with like reference numerals of the wiring substrate 10 and are not described in further detail.

As illustrated in FIG. 16, the fine-size component 64 having a spherical shape may be used instead of the fine-size component 14. Similar as the fine-size component 14, the fine-size component 64 may be inserted or pressed into the hole 12*x* of the glass cloth 12 before the weaving process 23 (see FIG. 7), before the resin impregnation process (see FIG. 9), or after the resin impregnation process (see FIG. 10).

Further, as illustrated in FIG. 17A, a spherical fine-size component 74, which has a diameter less than that of the fine-size component 64, may be inserted to the hole 12*x* of the glass cloth 12. After inserting the fine-size component 74, the shape of the fine-size component 74 may be deformed into a circular cylindrical shaped fine-size component 84 by applying pressure to the top and bottom of the fine-size component 74 as illustrated in FIG. 17B. By applying pressure to the fine-size component 74, the diameter of the fine-size component 84 becomes larger than the diameter of the fine-size component 74.

Even in a case where the fine-size component 64 or the fine-size component 84 is used instead of the fine-size component 14, the third modified example of the first embodiment can attain the same advantages (effects) as those of the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising: an insulation layer including a thermosetting resin and a reinforcement member having a plurality of first fiber bundles and a plurality of second fiber bundles woven together, the second fiber bundles being intersected with the first fiber bundles; a pair of differential wirings arranged alongside each other on the insulation layer; and a plurality of holes surrounded by the first fiber bundles and the second fiber bundles;

wherein a part of the plurality of holes is expanded, wherein a component is inserted into the part of the plurality of holes, wherein the first fiber bundles and the second fiber bundles have a curved portion relative to a plan view of the insulation layer in a region on which the pair of differential wirings is arranged, wherein the first fiber bundles and the second fiber bundles are configured to meander relative to the plan view of the insulation layer by the expansion of the part of the plurality of holes, wherein the pair of differential wirings extend in a direction that is diagonal to the first and second fiber bundles and orthogonal to a direction in which the component is inserted.

2. The wiring substrate as claimed in claim 1, wherein a pitch between adjacent first fiber bundles and between adjacent second fiber bundles is varied with location in the region.

3. The wiring substrate as claimed in claim 1, wherein the plurality of holes has different dimension therebetween in the region.

4. The wiring substrate as claimed in claim 1, wherein the expanded part of the plurality of holes are arranged in grid pattern.

5. The wiring substrate as claimed in claim 1, wherein the expanded part of the plurality of holes are arranged in staggered pattern.

6. The wiring substrate as claimed in claim 1, wherein the curved portion of the first and second fiber bundles is periodically arranged in the region relative to the plan view of the insulation layer.

* * * * *